(12) United States Patent
Hashemi et al.

(10) Patent No.: US 10,243,065 B2
(45) Date of Patent: Mar. 26, 2019

(54) METHOD OF MANUFACTURING SOI LATERAL SI-EMITTER SIGE BASE HBT

(71) Applicant: International Business Machines Corporation, Armonk, NY (US)

(72) Inventors: Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/903,945

(22) Filed: Feb. 23, 2018

(65) Prior Publication Data

US 2018/0190803 A1 Jul. 5, 2018

Related U.S. Application Data

(62) Division of application No. 15/272,014, filed on Sep. 21, 2016, now Pat. No. 9,935,186.

(51) Int. Cl.
*H01L 29/66* (2006.01)
*H01L 29/737* (2006.01)
*H01L 29/165* (2006.01)
*H01L 29/73* (2006.01)
(Continued)

(52) U.S. Cl.
CPC ...... *H01L 29/7378* (2013.01); *H01L 29/0649* (2013.01); *H01L 29/1008* (2013.01); *H01L 29/165* (2013.01); *H01L 29/66242* (2013.01); *H01L 29/737* (2013.01); *H01L 29/7317* (2013.01)

(58) Field of Classification Search
CPC .......... H01L 29/66242; H01L 29/0821; H01L 29/10004
See application file for complete search history.

(56) References Cited

U.S. PATENT DOCUMENTS

| | | | | |
|---|---|---|---|---|
| 5,668,396 | A | * | 9/1997 | Sato .................... H01L 29/1004 257/373 |
| 6,683,366 | B1 | * | 1/2004 | Schuegraf ......... H01L 29/66242 257/197 |

(Continued)

OTHER PUBLICATIONS

Ning, T. H., et al., "On the Performance and Scaling of Symmetric Lateral Bipolar Transistors on SOI", IEEE Journal of the Electron Devices Society, Jan. 2013, pp. 21-27, vol. 1, No. 1.

(Continued)

*Primary Examiner* — Thao P Le
(74) *Attorney, Agent, or Firm* — Scully, Scott, Murphy & Presser, P.C.; L. Jeffrey Kelly, Esq.

(57) ABSTRACT

A SOI lateral heterojunction Si-emitter SiGe-base bipolar transistor is provided that contains an intrinsic base region that includes a small band gap region (i.e., a silicon germanium alloy base of a first conductivity type) and a large band gap region (i.e., a silicon region of the first conductivity type) A silicon emitter of a second conductivity type that is opposite the first conductivity type is formed on the large-band gap side of the intrinsic base region and a silicon collector of the second conductivity type is formed on the small-band gap side of the intrinsic base region.

20 Claims, 3 Drawing Sheets

(51) Int. Cl.
*H01L 29/10* (2006.01)
*H01L 29/06* (2006.01)

(56) References Cited

U.S. PATENT DOCUMENTS

| | | | |
|---|---|---|---|
| 7,268,376 B2* | 9/2007 | Park | H01L 29/1004 257/197 |
| 7,906,403 B2* | 3/2011 | Donkers | H01L 29/66242 257/526 |
| 8,420,493 B2 | 4/2013 | Ning et al. | |
| 9,287,264 B1 | 3/2016 | Cheng et al. | |
| 2001/0017399 A1* | 8/2001 | Oda | H01L 29/66242 257/565 |
| 2003/0094662 A1 | 5/2003 | Bae et al. | |
| 2004/0007724 A1 | 1/2004 | Murthy et al. | |
| 2004/0195587 A1* | 10/2004 | Tsai | H01L 29/1004 257/197 |
| 2006/0011943 A1* | 1/2006 | Howard | H01L 29/0649 257/197 |
| 2006/0145273 A1 | 7/2006 | Curello et al. | |
| 2007/0249168 A1 | 10/2007 | Rotondaro et al. | |
| 2009/0008705 A1 | 1/2009 | Zhu et al. | |
| 2010/0224938 A1 | 9/2010 | Zhu | |
| 2013/0277804 A1* | 10/2013 | Cheng | H01L 29/66287 257/586 |
| 2015/0357446 A1* | 12/2015 | Tschumakow | H01L 29/66242 257/586 |
| 2016/0064484 A1* | 3/2016 | Harame | H01L 29/1004 257/163 |
| 2018/0047837 A1* | 2/2018 | Shyu | H01L 29/7371 |

OTHER PUBLICATIONS

Ning, T. H., "Bipolar Device Design", Section 7.4.4 of Taur and Ning, Fundamentals of Modern VLSI Devices, Second Edition, Cambridge University Press, 2009, pp. 374-436.
List of IBM Patents or Patent Applications Treated as Related Dated Feb. 23, 2018, 2 Pages.

* cited by examiner

METHOD OF MANUFACTURING SOI LATERAL SI-EMITTER SIGE BASE HBT

BACKGROUND

The present application relates to a semiconductor structure and a method of forming the same. More particularly, the present application relates to a SOI lateral heterojunction Si-emitter SiGe-base bipolar transistor that includes a step germanium distribution in the base region which results in a step energy band gap in the base that provides a high unity gain bandwidth, $f_T$, and a high maximum oscillation frequency, $f_{max}$. The present application also provides a method of forming such a SOI lateral heterojunction Si-emitter SiGe-base bipolar transistor.

Bipolar junction transistors are typically found in demanding types of analog circuits, especially analog circuits used in high-frequency applications. For example, bipolar junction transistors can be found in radio frequency integrated circuits (RFICs) used in wireless communication systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors, such as vertical bipolar transistors, include three semiconductor regions, namely the emitter, base, and collector regions. Generally, a bipolar junction transistor includes a pair of p-n junctions, namely an emitter-base junction and a collector-base junction. A heterojunction bipolar transistor (HBT) is a variety of a bipolar junction transistor that employs at least two semiconductor materials with unequal band gaps for the emitter/collector and base regions, creating a heterojunction.

With the advent of semiconductor-on-insulator (SOI) technology, innovative thin-base lateral bipolar transistors such as, for example, a SOI lateral heterojunction Si-emitter SiGe-base bipolar transistor, have been developed. A need exists for providing SOI lateral heterojunction Si-emitter SiGe-base bipolar transistors that have a higher unity gain bandwidth, $f_T$, and a higher maximum oscillation frequency, $f_{max}$, than presently available SOI lateral heterojunction Si-emitter SiGe-base bipolar transistors.

SUMMARY

A SOI lateral heterojunction Si-emitter SiGe-base bipolar transistor is provided that contains an intrinsic base region that includes a small band gap region (i.e., a silicon germanium alloy base of a first conductivity type) and a large band gap region (i.e., a silicon region of the first conductivity type). A silicon emitter of a second conductivity type that is opposite the first conductivity type is formed on one side of the intrinsic base region and a silicon collector of the second conductivity type is formed on another side of the intrinsic base region. The SOI lateral heterojunction Si-emitter SiGe-base bipolar transistor of the present application has a higher unity gain bandwidth, $f_T$, and a higher maximum oscillation frequency, $f_{max}$, than presently available SOI lateral heterojunction Si-emitter SiGe-base bipolar transistors.

One aspect of the present application relates to a semiconductor structure, i.e., a SOI lateral heterojunction Si-emitter SiGe-base bipolar transistor. In one embodiment, the semiconductor structure includes a silicon germanium alloy base of a first conductivity type located on an insulator layer. The semiconductor structure further includes a silicon region of the first conductivity type in direct contact with a first sidewall of the silicon germanium alloy base and located on the insulator layer, a silicon region of a second conductivity type that is opposite from the first conductivity type in direct contact with a second sidewall of the silicon germanium alloy base and located on the insulator layer, a silicon emitter of the second conductivity type in direct contact with a sidewall of the silicon region of the first conductivity type and located on the insulator layer, and a silicon collector of the second conductivity type in direct contact with a sidewall of the silicon region of the second conductivity type and located on the insulator layer.

Another aspect of the present application relates to a method of forming a semiconductor structure, i.e., a SOI lateral heterojunction Si-emitter SiGe-base bipolar transistor. In one embodiment, the method includes providing a SiGe-on-insulator substrate comprising, from bottom to top, a handle substrate, an insulator layer, and a silicon germanium alloy base layer of a first conductivity type. A patterned material stack of, from bottom to top, an extrinsic base semiconductor material of the first conductivity type, and a hard mask is then formed on the silicon germanium alloy base layer. A spacer is then formed on exposed sidewalls of the patterned material stack. The silicon germanium alloy base layer is then etched to provide an undercut region beneath each spacer. Next, and in any order, a silicon region of the first conductivity type is formed in one of the undercut regions, and a silicon region of a second conductivity type that is different from the first conductivity type is formed in another of the undercut regions. After forming the silicon regions, a silicon emitter of the second conductivity type is formed in direct contact with a sidewall of the silicon region of the first conductivity type, and a silicon collector of the second conductivity type is formed in direct contact with a sidewall of the silicon region of the second conductivity type.

DETAILED DESCRIPTION

Figure 1:
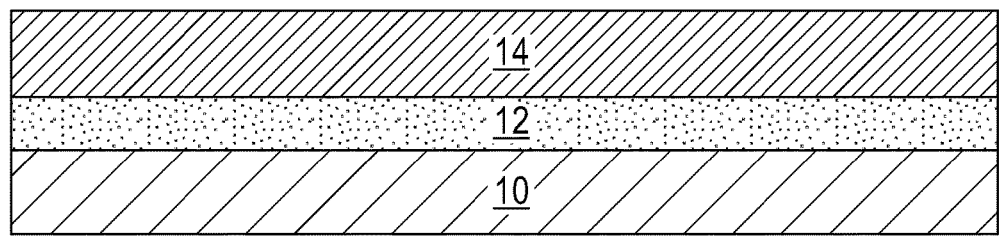
FIG. 1 is a cross sectional view of an exemplary semiconductor structure including, from bottom to top, a handle substrate, an insulator layer, and a silicon germanium alloy base layer of a first conductivity type that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. As is shown, the exemplary semiconductor structure of FIG. 1 includes, from bottom to top, a handle substrate 10, an insulator layer 12, and a silicon germanium alloy base layer 14 of a first conductivity type. Collectively, the handle substrate 10, the insulator layer 12, and the silicon germanium alloy base layer 14 can be referred to as a SiGe-on-insulator (i.e., SGOI) substrate.

In one embodiment, the handle substrate 10 may comprise a semiconductor material having semiconducting properties. Illustrative semiconductor materials that can be employed as the handle substrate 10 include, for example, silicon (Si), germanium (Ge), silicon germanium alloys (SiGe), silicon germanium carbide (SiGeC), III-V compound semiconductors, II-VI compound semiconductors or multilayered stacks thereof. III-V compound semiconductors include at least one element from Group III of the Periodic Table of Elements and at least one element from Group V of the Periodic Table of Elements. II-VI compound semiconductors include at least one element from Group II of the Periodic Table of Elements and at least one element from Group VI of the Periodic Table of Elements.

The insulator layer 12 may comprise a crystalline or non-crystalline dielectric material such as an oxide and/or nitride. In one example, the insulator layer 12 may be composed of silicon dioxide. In another example, the insulator layer 12 may be composed of silicon nitride or boron nitride. In yet another example, the insulator layer 12 may be composed of a multilayered stack of silicon dioxide and boron nitride. The insulator layer 12 may have a thickness from 20 nm to 500 nm; although other thicknesses that are lesser than, or greater than, the aforementioned thickness range may also be employed as the thickness of the insulator layer 12.

The silicon germanium alloy base layer 14 is composed of a silicon germanium alloy that may have a germanium content of from 20 atomic percent germanium to 70 atomic percent germanium. Other germanium contents that are lesser than 20 atomic percent, or greater than 70 atomic percent can also be used as the germanium content of the silicon germanium alloy base layer 14. The silicon germanium alloy base layer 14 may have a thickness from 10 nm to 200 nm; although other thicknesses that are lesser than, or greater than, the aforementioned thickness range may also be employed as the thickness of the silicon germanium alloy base layer 14.

As mentioned above, the silicon germanium alloy base layer 14 is of first conductivity type. By "first conductivity type" it is meant that a semiconductor material layer such as the silicon germanium alloy base layer 14 includes a p-type dopant or an n-type dopant. In one embodiment, the silicon germanium alloy base layer 14 contains a p-type dopant. In another embodiment, the silicon germanium alloy base layer 14 contains an n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The concentration of dopant used in providing the silicon germanium alloy base layer 14 of the first conductivity type can range from about $1 \times 10^{17}$ atoms/cm$^3$ to about $1 \times 10^{19}$ atoms/cm$^3$. The dopant atoms that provide the silicon germanium alloy base layer 14 of the first conductivity type can be introduced during the formation of the silicon germanium alloy base layer 14 or after formation of an intrinsic silicon germanium alloy base layer utilizing ion implantation or gas phase doping.

The SGOI substrate (10, 12, 14) shown in FIG. 1 may be formed utilizing conventional processes well known to those skilled in the art. In one example, the SGOI substrate (10, 12, 14) shown in FIG. 1 may be formed by wafer bonding. In another example, the SGOI substrate (10, 12, 14) shown in FIG. 1 may be formed utilizing a thermal mixing process or a thermal condensation process. In such an embodiment, a sacrificial material stack including silicon and a silicon germanium alloy layer having an initial germanium content is first provided and then thermal mixing or thermal condensation can be employed to provide silicon germanium alloy base layer 14; the germanium content within the silicon germanium alloy base layer 14 differs from the initial germanium content employed in the silicon germanium alloy layer of the sacrificial material stack. Thermal mixing includes annealing in an inert ambient (e.g., helium and/or argon), while thermal condensation includes annealing in an oxidizing ambient (e.g., air, oxygen or ozone). The anneal temperature for both thermal mixing and thermal condensation can be from 600° C. to 1200° C.

Figure 2:
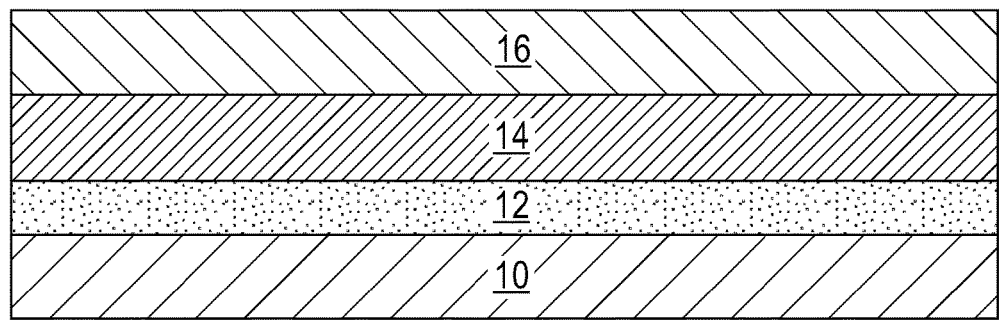
FIG. 2 is a cross sectional view of the exemplary semiconductor structure of FIG. 1 after forming an extrinsic base semiconductor material layer of the first conductivity type on the silicon germanium alloy base layer.

Referring now to FIG. 2, there is illustrated the exemplary semiconductor structure of FIG. 1 after forming an extrinsic base semiconductor material layer 16 of the first conductivity type on the silicon germanium alloy base layer 14. In the present application, the concentration of dopant used in providing the extrinsic base semiconductor material layer 16 is greater than the concentration of the dopant present in the silicon germanium alloy base layer 14.

The extrinsic base semiconductor material layer 16 is composed of a polycrystalline or crystalline semiconductor material. In one embodiment, the extrinsic base semiconductor material layer 16 may be composed of polycrystalline silicon. In another embodiment, the extrinsic base semiconductor material layer 16 may be composed of a polycrystalline silicon germanium alloy.

In one embodiment, the extrinsic base semiconductor material layer 16 of the first conductivity type may be formed utilizing an in-situ dopant deposition process. In another embodiment, the extrinsic base semiconductor material layer 16 of the first conductivity type may be formed by first depositing an intrinsic semiconductor material layer and thereafter introducing a dopant into the intrinsically deposited semiconductor material layer utilizing ion implantation, gas phase doping, plasma doping, or diffusion of electrical dopants from a disposable dopant source layer (such as a phosphosilicate glass layer, a borosilicate glass layer, or an arsenosilicate glass layer). The semiconductor material that provides the extrinsic base semiconductor material layer 16 can be deposited, for example, by chemical vapor deposition (CVD) or physical vapor deposition (PVD). The thickness of the extrinsic base semiconductor material layer 16 can be from 20 nm to 500 nm, although lesser and greater thicknesses can also be employed.

Figure 3:
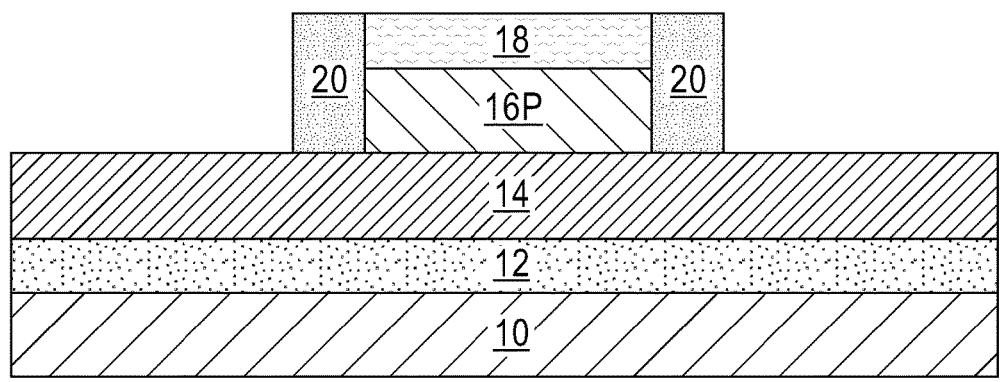
FIG. 3 is a cross sectional view of the exemplary semiconductor structure of FIG. 2 after forming a hard mask layer on the extrinsic base semiconductor material layer, patterning the hard mask layer and the extrinsic base semiconductor material layer, and then forming a first spacer on each exposed sidewall of a remaining portion of the hard mask layer and a remaining portion of the extrinsic base semiconductor material layer.

Referring now to FIG. 3, there is illustrated the exemplary semiconductor structure of FIG. 2 after forming a hard mask layer (not specifically shown) on the extrinsic base semiconductor material layer 16, patterning the hard mask layer and the extrinsic base semiconductor material layer 16, and then forming a first spacer 20 on each exposed sidewall of a remaining portion of the hard mask layer (i.e., hard mask 18) and a remaining portion of the extrinsic base semiconductor material layer (i.e., extrinsic base semiconductor material 16P). The remaining portion of the hard mask layer and the remaining portion of the extrinsic base semiconductor material layer constitute a patterned material stack of, from bottom to top, the extrinsic base semiconductor material 16P and the hard mask 18.

The hard mask layer that provides hard mask 18 may include any hard mask material such as, for example, silicon dioxide, silicon nitride and/or silicon oxynitride. The hard mask layer is continuous layer that covers the entirety of the extrinsic base semiconductor material layer 16. In some embodiments, the hard mask layer that provides hard mask 18 may be formed utilizing a deposition process such as, for example, chemical vapor deposition or plasma enhanced chemical vapor deposition. In other embodiments, the hard mask layer that provides hard mask 18 may be formed utilizing a thermal process such as, for example, thermal oxidation and/or thermal nitridation. In yet other embodiments, the hard mask layer that provides hard mask 18 can be formed utilizing a combination of a deposition process and a thermal process. The thickness of the hard mask layer that provides hard mask 18 can range from 20 nm to 200 nm, although lesser and greater thicknesses can also be employed.

After forming the hard mask layer, the hard mask layer and the extrinsic base semiconductor material layer 16 are patterned. Patterning may be performed utilizing lithography and etching. Lithography includes forming a photoresist (not shown) atop a material or material stack to be patterned, exposing the photoresist to a desired pattern of radiation, and developing the exposed photoresist utilizing a conventional photoresist developer to provide a patterned photoresist. The photoresist may be a positive-tone photoresist, a negative-tone photoresist or a hybrid-tone photoresist. The photoresist may be formed utilizing a conventional deposition process such as, for example, spin-on coating. The etch used in the patterning process may include a dry etching process (such as, for example, reactive ion etching, ion beam etching, plasma etching or laser ablation), a wet chemical etch process or any combination of dry and wet etching. The patterned photoresist may be removed from the structure anytime after the pattern has been transferred into the hard mask layer. The patterned photoresist may be removed utilizing any conventional resist stripping process such as, for example, ashing.

After patterning the hard mask layer and the extrinsic base semiconductor material layer 16, the hard mask 18 and the extrinsic base semiconductor material 16P of the patterned material stack have sidewalls that are vertically aligned to each other. Thus, the hard mask 18 and the extrinsic base semiconductor material 16P of the patterned material stack have identical widths.

After providing the patterned material stack of the hard mask 18 and the extrinsic base semiconductor material 16P, a first spacer 20 is formed on each exposed sidewall of the patterned material stack (18, 16P). The first spacer 20 is composed of a dielectric spacer material such as, for example, silicon dioxide, silicon nitride, or silicon oxynitride. In one embodiment, the dielectric spacer material that provides first spacer 20 is composed of a same dielectric material as the hard mask layer. In another embodiment, the dielectric spacer material that provides first spacer 20 is composed of a different dielectric material than the hard mask layer. The first spacer 20 may be formed by deposition of the dielectric spacer material, followed by etching the dielectric spacer material utilizing a spacer etch such as, for example, a reactive ion etch.

Figure 4:
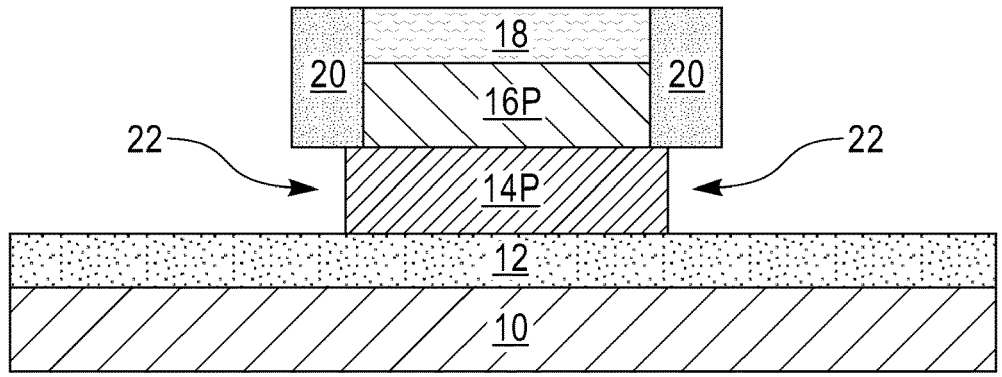
FIG. 4 is a cross sectional view of the exemplary semiconductor structure of FIG. 3 after etching the silicon germanium alloy base layer to provide an undercut region beneath each first spacer.

Referring now to FIG. 4, there is illustrated the exemplary semiconductor structure of FIG. 3 after etching the silicon germanium alloy base layer 14 to provide an undercut region 22 beneath each first spacer 20. As is shown in FIG. 4, a portion of the silicon germanium alloy base layer 14 remains after the etch. The portion of the silicon germanium alloy base layer 14 that remains after the etch may be referred to as silicon germanium alloy base 14P. In some embodiments and as is shown, the silicon germanium alloy base 14P has width that is greater than a width of the extrinsic base semiconductor material 16P. In other embodiments (not shown), the silicon germanium alloy base 14P has width that is equal to, or less than a width of the extrinsic base semiconductor material 16P.

The etching of the silicon germanium alloy base layer 14 is performed utilizing the patterned material stack (18, 16P) and each first spacer 20 as a combined etch mask. In some embodiments, the etching of the silicon germanium alloy base layer 14 may include an anisotropic etch followed by a lateral etching process.

Figure 5:
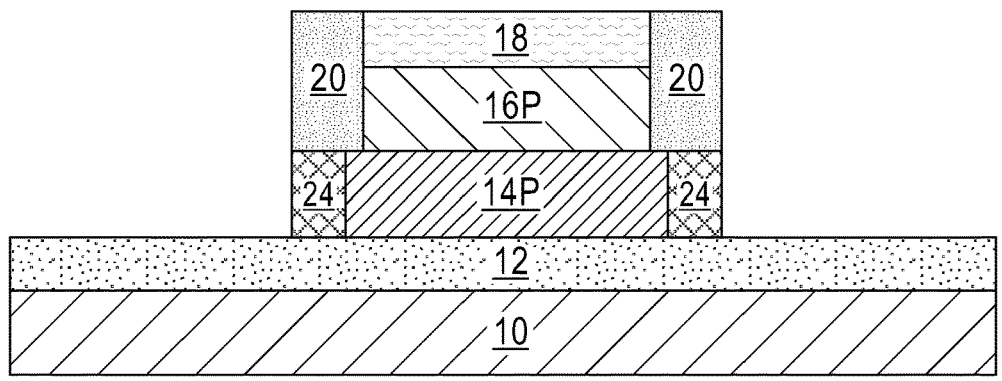
FIG. 5 is a cross sectional view of the exemplary semiconductor structure of FIG. 4 after epitaxially growing a region of silicon within each undercut region and from exposed sidewalls of a remaining portion of the silicon germanium alloy base layer.

Referring now to FIG. 5, there is illustrated the exemplary semiconductor structure of FIG. 4 after epitaxially growing a region of silicon 24 within each undercut region 22 and from exposed sidewalls of the remaining portion of the silicon germanium alloy base layer (i.e., the silicon germanium alloy base 14P). In some embodiments, an anisotropic etch such as, for example, reactive ion etching, can follow the epitaxial growth of each region of silicon 24.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application each region of silicon 24 has an epitaxial relationship with the exposed sidewall of the silicon germanium alloy base 14P. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming each region of silicon 24 may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for the epitaxial deposition process typically ranges from 250° C. to 900° C. Although higher temperature typically results in faster deposition, the faster deposition may result in crystal defects and film cracking. A number of different silicon-containing source gases may be used for the deposition of the each region of silicon 24. In one embodiment, the silicon-containing source gas includes a silane or a disilane. Carrier gases like hydrogen, nitrogen, helium and argon can be used.

Each region of silicon 24 is non-doped at this point of the present application. As is shown, each region of silicon 24 has an innermost sidewall directly contacting an exposed sidewall of the silicon germanium alloy base 14P and an outermost sidewall that is vertically aligned to an outermost sidewall of one of the first spacers 20. As is further shown, each region of silicon 24 has a topmost surface that is coplanar with a topmost surface of the silicon germanium alloy base 14P and a bottommost surface that is coplanar with a bottommost surface of the silicon germanium alloy base 14P; the bottommost surface of the silicon germanium alloy base 14P and the bottommost surface of each region of silicon 24 are located on different portions of the topmost surface of the insulator layer 12.

Figure 6:
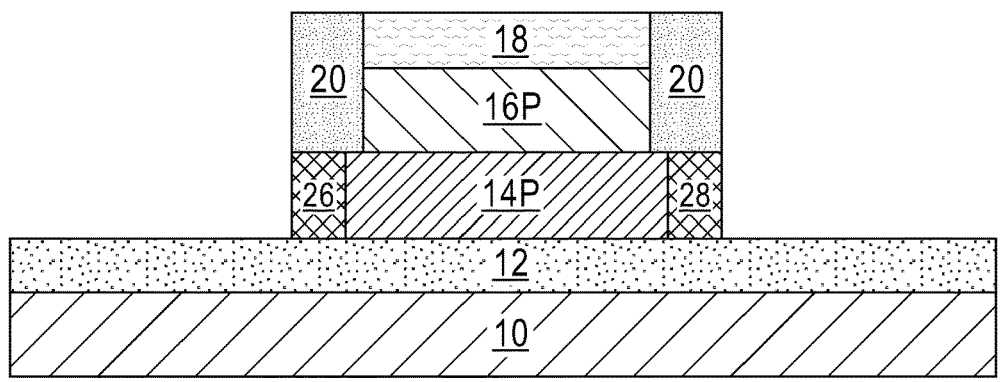
FIG. 6 is a cross sectional view of the exemplary semiconductor structure of FIG. 5 after implanting dopants of the first conductivity type into the region of silicon formed on one side of the remaining portion of the silicon germanium alloy base layer, and implanting dopants of a second conductivity type that is opposite from the first conductivity type into the region of silicon formed on another side of the remaining portion of the silicon germanium alloy base layer.

Referring now to FIG. 6, there is illustrated the exemplary semiconductor structure of FIG. 5 after implanting at an angle dopants of the first conductivity type into the region of silicon 24 formed on one side of the remaining portion of the silicon germanium alloy base layer (i.e., the silicon germanium alloy base 14P), and implanting at an angle dopants of a second conductivity type that is opposite from the first conductivity type into the region of silicon 24 formed on another side of the remaining portion of the silicon germanium alloy base layer (i.e., the silicon germanium alloy base 14P). The implanting of the dopants into the different regions of silicon 24 may be performed in any order.

The region of silicon 24 that includes the first conductive type dopants may be referred to as a silicon region 26 of the first conductivity type, while the region of silicon 24 that includes the second conductivity type dopants may be referred to as a silicon region 28 of the second conductivity type. In one example, the first conductivity type is p-type and the second conductivity type is n-type. In another example, the first conductivity type is n-type and the second conductivity type is p-type.

The silicon region 26 and the silicon region 28 are formed utilizing separated angled ion implantation processes. The concentration of dopants within the silicon region 26 may be lesser than, equal to, or greater than, the dopants within the silicon region 28. The concentration of dopants within the silicon region 26 and within silicon region 28 is typically within the range mentioned above for the dopants present in the silicon germanium alloy base layer 14.

As is shown, each of the silicon regions 26, 28 that is formed has an innermost sidewall directly contacting an exposed sidewall of the silicon germanium alloy base 14P and an outermost sidewall that is vertically aligned to an outermost sidewall of one of the first spacers 20. As is further shown, each of the silicon regions 26, 28 has a topmost surface that is coplanar with a topmost surface of the silicon germanium alloy base 14P and a bottommost surface that is coplanar with a bottommost surface of the silicon germanium alloy base 14P; the bottommost surface of the silicon germanium alloy base 14P and the bottommost surface of each of the silicon regions 26, 28 are located on different portions of the topmost surface of the insulator layer 12.

This step provides an intrinsic base region that includes a small band gap region (i.e., the silicon germanium alloy base 14 of the first conductivity type) and a large band gap region (i.e., the silicon region 26 of the first conductivity type). Such an intrinsic base region has a step germanium distribution in the base region which results in a step energy band gap in the base that provides a high unity gain bandwidth, $f_T$, and a high maximum oscillation frequency, $f_{max}$.

Figure 7:
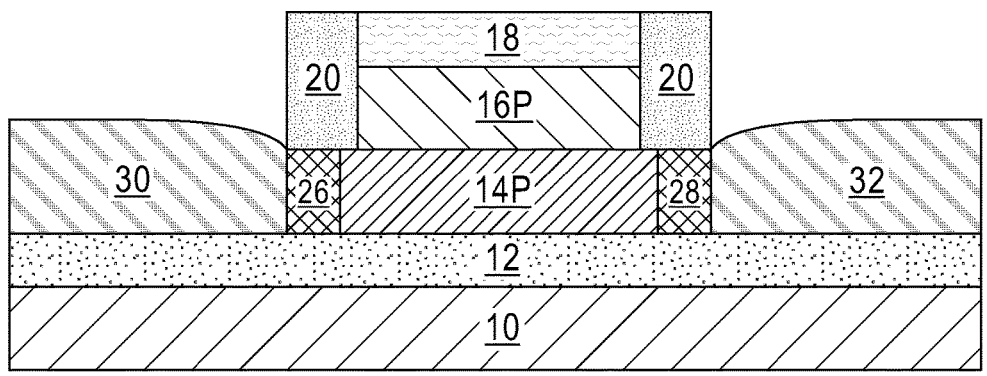
FIG. 7 is a cross sectional view of the exemplary semiconductor structure of FIG. 6 after forming a silicon emitter of the second conductivity type from an exposed sidewall of the silicon region of the first conductivity type, and a silicon collector of the second conductivity type from an exposed sidewall of the silicon region of the second conductivity type.

Referring now to FIG. 7, there is illustrated the exemplary semiconductor structure of FIG. 6 after forming, in any order, a silicon emitter 30 of the second conductivity type from an exposed sidewall of the silicon region 26 containing the first conductivity type dopant, and a silicon collector 32 of the second conductivity type from an exposed sidewall of the silicon region 28 containing the second conductivity type dopant. The silicon emitter 30 and the silicon collector 32 are formed on different portions of the insulator layer 12. The bottommost surface of both the silicon emitter 30 and the silicon collector 32 is coplanar with a bottommost surface of each of the silicon regions 26, 28 as well as the bottommost surface of the silicon germanium alloy base 14P.

The silicon emitter 30 of the second conductivity type and the silicon collector 32 of the second conductivity type can be formed utilizing an epitaxial growth (or deposition) process as mentioned above. In some embodiments, the dopant that provides the second conductivity type of the silicon emitter 30 and silicon collector 32 can be introduced during the epitaxial growth process itself. In other embodiments, the dopant that provides the second conductivity type of the silicon emitter 30 and silicon collector 32 can be introduced after epitaxial growth of intrinsic silicon utilizing one of ion implantation or gas phase doping.

The concentration of dopants used in providing both the silicon emitter 30 and the silicon collector 32 is greater than the dopant concentration in silicon regions 26, 28. Typically, the concentration of dopants used in providing both the silicon emitter 30 and the silicon collector 32 can range from about $1 \times 10^{19}$ atoms/cm$^3$ to about $5 \times 10^{20}$ atoms/cm$^3$.

Figure 8:
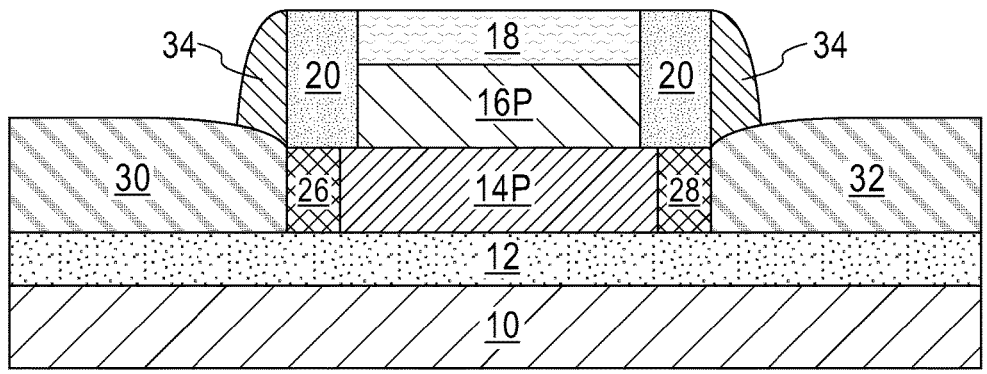
FIG. 8 is a cross sectional view of the exemplary semiconductor structure of FIG. 7 after forming a second spacer on outer sidewalls of each first spacer.

Referring now to FIG. 8, there is illustrated the exemplary semiconductor structure of FIG. 7 after forming a second spacer 34 on outer sidewalls of each first spacer 20; the formation of the second spacer 34 may serve to passivate the emitter-base junction. In some embodiments, the formation of the second spacer 34 can be omitted. The second spacer 34 may include one of the dielectric spacer materials mentioned above for providing the first spacer 20. The second spacer 34 may be formed utilizing the technique mentioned above in forming the first spacer 20.

FIGS. 7 and 8 illustrate an exemplary semiconductor structure of the present application. The exemplary semiconductor structure includes a silicon germanium alloy base 14P of a first conductivity type located on an insulator layer 12. The exemplary semiconductor structure further includes a silicon region 26 of the first conductivity type in direct contact with a first sidewall of the silicon germanium alloy base 14P and located on the insulator layer 12, a silicon region 28 of a second conductivity type that is opposite from the first conductivity type in direct contact with a second sidewall of the silicon germanium alloy base 14P and located on the insulator layer 12, a silicon emitter 30 of the second conductivity type in direct contact with a sidewall of the silicon region 26 of the first conductivity type and located on the insulator layer 12, and a silicon collector 32 of the second conductivity type in direct contact with a sidewall of the silicon region 28 of the second conductivity type and located on the insulator layer 12. As is further shown, the exemplary semiconductor structure further includes an extrinsic base semiconductor material 16P of the first conductivity type located on a topmost surface of the silicon germanium alloy base 14P.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a silicon germanium alloy base of a first conductivity type located on an insulator layer;
a silicon region of the first conductivity type in direct contact with a first sidewall of the silicon germanium alloy base and located on the insulator layer;
a silicon region of a second conductivity type that is opposite from the first conductivity type in direct contact with a second sidewall of the silicon germanium alloy base and located on the insulator layer;
a silicon emitter of the second conductivity type in direct contact with a sidewall of the silicon region of the first conductivity type and located on the insulator layer; and
a silicon collector of the second conductivity type in direct contact with a sidewall of the silicon region of the second conductivity type and located on the insulator layer.

2. The semiconductor structure of claim 1, further comprising an extrinsic base semiconductor material of the first conductivity type located on a topmost surface of the silicon germanium alloy base.

3. The semiconductor structure of claim 2, further comprising a hard mask located on a topmost surface of the extrinsic base semiconductor material, and a first spacer located on exposed sidewalls of the hard mask and the extrinsic base semiconductor material.

4. The semiconductor structure of claim 3, wherein the exposed sidewalls of the hard mask and the extrinsic base semiconductor material are vertically aligned to each other.

5. The semiconductor structure of claim 2, wherein the extrinsic base semiconductor material is selected from silicon and a silicon germanium alloy.

6. The semiconductor structure of claim 2, wherein a width of the silicon germanium alloy base is greater than a width of the extrinsic base semiconductor material.

7. The semiconductor structure of claim 1, wherein a topmost surface of each of the silicon regions is coplanar with a topmost surface of the silicon germanium alloy base.

8. The semiconductor structure of claim 3, further comprising a second spacer located on an outermost sidewall of each first spacer.

9. The semiconductor structure of claim 1, wherein the first conductivity type is p-type and the second conductivity type is n-type.

10. The semiconductor structure of claim 1, wherein the first conductivity type is n-type and the second conductivity type is p-type.

11. The semiconductor structure of claim 2, wherein a concentration of dopants that provides the first conductivity type of the extrinsic base semiconductor material is greater than a concentration of dopants that provides the first conductivity type of silicon germanium alloy base.

12. The semiconductor structure of claim 1, wherein the insulator layer is located on a topmost surface of a handle substrate.

13. The semiconductor structure of claim 1, wherein the silicon germanium alloy base has a germanium content from 20 atomic present to 20 atomic percent.

14. The semiconductor structure of claim 2, wherein the extrinsic base semiconductor material is composed of a polycrystalline semiconductor material.

15. The semiconductor structure of claim 2, wherein the extrinsic base semiconductor material is composed of a single crystalline semiconductor material.

16. The semiconductor structure of claim 1, wherein the silicon regions have an epitaxial relationship with the silicon germanium alloy base.

17. The semiconductor structure of claim 1, wherein the silicon emitter and the silicon collector have a bottommost surface that is coplanar with each other and is further coplanar with a bottommost surface of each of the silicon regions and a bottommost surface of the silicon germanium alloy base.

18. The semiconductor structure of claim 1, wherein the silicon emitter and the silicon collector have a height that is greater than a height of the silicon regions and a height of the silicon germanium alloy base.

19. The semiconductor structure of claim 1, wherein the silicon emitter has an epitaxial relationship with the silicon region containing the first conductivity type dopant.

20. The semiconductor structure of claim 19, wherein the silicon collector has an epitaxial relationship with the silicon region containing the second conductivity type dopant.

\* \* \* \* \*